United States Patent
Beinglass et al.

[11] Patent Number: 5,876,797
[45] Date of Patent: *Mar. 2, 1999

[54] LOW TEMPERATURE HIGH PRESSURE SILICON DEPOSITION METHOD

[75] Inventors: Israel Beinglass, Sunnyvale; David K. Carlson, Santa Clara, both of Calif.

[73] Assignee: Applied Materials, Inc., Santa Clara, Calif.

[*] Notice: The term of this patent shall not extend beyond the expiration date of Pat. No. 5,607,724.

[21] Appl. No.: 946,845

[22] Filed: Oct. 8, 1997

Related U.S. Application Data

[63] Continuation of Ser. No. 668,025, Jun. 19, 1996, Pat. No. 5,700,520, which is a continuation of Ser. No. 430,582, Apr. 28, 1995, Pat. No. 5,607,724, which is a continuation of Ser. No. 166,655, Dec. 13, 1993, abandoned, which is a continuation of Ser. No. 1,216, Jan. 6, 1993, abandoned, which is a continuation of Ser. No. 742,954, Aug. 9, 1991, abandoned.

[51] Int. Cl.⁶ ................................................. C23C 16/00
[52] U.S. Cl. ................... 427/255.1; 427/255; 427/255.2; 427/314; 438/488; 148/122
[58] Field of Search ................. 427/255.1, 255.2, 427/255, 314; 438/488; 148/122

[56] References Cited

U.S. PATENT DOCUMENTS

| | | | |
|---|---|---|---|
| 4,237,150 | 12/1980 | Wiesmann | 427/74 |
| 4,745,088 | 5/1988 | Inoue et al. | 437/102 |

FOREIGN PATENT DOCUMENTS

| | | | |
|---|---|---|---|
| 63-3414 | 1/1988 | Japan | H01L 21/205 |

*Primary Examiner*—Roy V. King
*Attorney, Agent, or Firm*—Birgit E. Morris

[57] ABSTRACT

A method of producing doped and undoped silicon layers on a substrate by chemical vapor deposition at elevated pressures of from about 10 to about 350 Torr whereby deposition occurs at practicable rates. A substrate is loaded in a vacuum chamber, the temperature adjusted to obtain a silicon deposit of predetermined crystallinity, and the silicon precursor gases fed to the chamber to a preselected high pressure. Both undoped and doped silicon can be deposited at high rates up to about 3000 angstroms per minute.

6 Claims, 2 Drawing Sheets

LOW TEMPERATURE HIGH PRESSURE SILICON DEPOSITION METHOD

This is a continuation of application Ser. No. 08/668,025 filed Jun. 19, 1996 U.S. Pat. No. 5,700,520, which is a continuation of Ser. No. 08/430,582 filed Apr. 28, 1995, U.S. Pat. No. 5,607,724 which is a continuation of Ser. No. 08/166,655 filed Dec. 13, 1993 abandoned, which is a continuation of Ser. No. 08/001,216 filed Jan. 6, 1993 abandoned, which is a continuation of Ser. No. 07/742,954 filed Aug. 9, 1991 abandoned.

This invention relates to a process for depositing undoped or doped silicon at high growth rates. More particularly, this invention relates to a process for depositing doped or undoped silicon in a single wafer chamber at practicable deposition rates.

BACKGROUND OF THE INVENTION

Conventional prior art doped or undoped silicon deposition has been carried out in accordance with a low pressure chemical vapor deposition process (LPCVD). A source of gas, such as silane, disilane, silicon tetrachloride and the like, which can also carry a dopant gas such as phosphine or arsine, is fed to a chamber containing a substrate on which the silicon layer is to be deposited. The substrate is heated to deposition temperature and the gases fed to the chamber where they are decomposed, whereupon silicon deposits on the surface of the substrate.

These systems are typically run at pressures of about 200 to 400 millitorr; thus the low pressure designation. However, at these pressures the silicon deposition rate is very low, on the order of about 100 angstroms per minute for undoped silicon and only about 50 angstroms per minute for doped silicon. The prior art processes have compensated for the low deposition rates by loading a plurality, e.g., of up to about 100, substrates at a time in a chamber to be processed.

In the prior art LPCVD system illustrated in FIG. 1, a chamber 10 includes a boat 11 carrying a plurality of silicon wafers 12. A gas feed from a gas source 13 is controlled by a flow controller 14 and enters the chamber 10 from gas inlet port 15. The gas feed is maintained across the wafers 12 in the direction of the arrows. The low pressure in the chamber 10 is maintained by an exhaust system 16. Because the concentration of the feed gases can decrease as they flow toward the exhaust system 16, the chamber also includes three separately controlled heater elements 17 that provide temperature variations in the chamber 10 to compensate for the variation of concentrations of reactant gases within the chamber 10.

FIG. 2 illustrates another prior art LPCVD batch-type silicon deposition chamber. In this chamber, a plurality of wafers 21 are stacked vertically and the reactant gases are injected through a plurality of holes 23 in a gas injector 22. The gas injector 22 is located between two rows of wafers 21. The low pressure in this chamber again enables sufficient uniformity of deposition that the deposition can be performed in a batch type process.

While careful adjustment of the gas pressures and temperatures can deposit smooth, uniform silicon films onto a substrate in this manner, the disadvantage is that if anything goes wrong during the deposition, e.g., a power outage, impurities in the feed gases or the like, a large batch of wafers is damaged and rendered useless.

Further, more modern equipment employs multiple chambers for the multiple process steps of preparing devices onto substrates such as silicon, gallium arsenide and the like. Several processes are sequentially performed on a single wafer in a series of interconnected chambers, all under vacuum. This eliminates the need to ramp pressures up and down between process steps which is both costly and exposes the substrates to contaminants in the ambient.

However, since the deposition of silicon in a LPCVD process is slow, the time required for processing one wafer at a time is unduly long and adds greatly to the costs of producing devices. Further, the silicon deposition step would be a bottleneck in multiple stage process equipment.

Thus a process that would improve the throughput of silicon deposition onto single substrates in a multiple stage reactor would be highly desirable.

SUMMARY OF THE INVENTION

We have found that the rate of deposition of doped and undoped silicon can be greatly increased by increasing the pressure within a single substrate CVD chamber. Deposition rates of 500–3000 angstroms per minute can be achieved at a gas pressure of about 25–350 Torr.

DETAILED DESCRIPTION OF THE INVENTION

In accordance with the present invention, a single substrate is loaded into a chamber of a multiple chamber reactor, the temperature of the wafer is adjusted to the desired deposition temperature, deposition gases are fed to the chamber at the desired pressure for the desired period to deposit undoped or doped silicon to a predetermined thickness.

In order to increase the deposition rate of doped or undoped silicon, the pressure in the chamber must be maintained at from about 10 to 350 Torr, preferably from about 25 to about 150 Torr. Deposition rates of up to about 3000 angstroms per minute of silicon can be achieved at these pressures. At lower pressures the deposition rate drops to about 500 angstroms per minute, which is somewhat below a commercially practicable rate of about 1000 angstroms per minute. Above about 350 Torr, a significant amount of deposition will occur on the walls and other fixtures of the reaction chamber and particulates that can contaminate the substrates can also be formed, which is undesirable. The unexpectedly large increase in deposition rate in accordance with the invention enables single substrate processing at time periods that remain competitive with multiple substrate batch processing.

This process is economical to deposit both undoped and doped silicon layers. Undoped silicon can be deposited using silane, disilane, silicon tetrachloride, silicon trichloride, silicon dichloride and the like. The exact crystallographic nature of the silicon deposited depends upon the temperature of deposition. For example, at low deposition temperatures of about 600°–650° C., the silicon deposited is mostly amorphous. At somewhat higher temperatures of about 650°–690° C. a mixture of amorphous and polysilicon will be obtained. At higher temperatures of about 690°–750° C. the deposited silicon will be mostly polycrystalline silicon.

Figure 1:
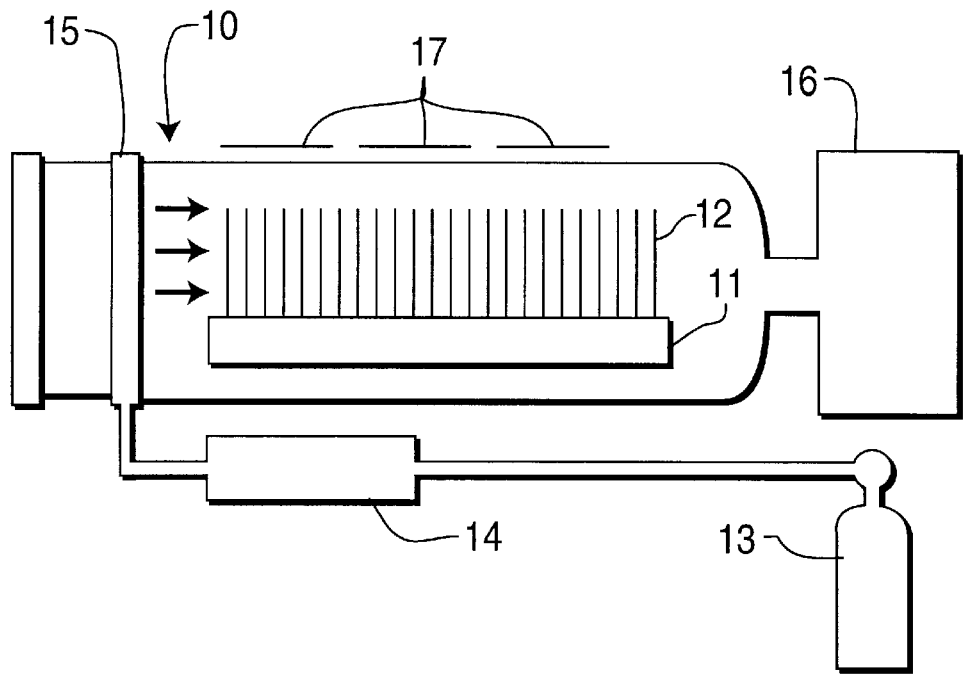
FIG. 1 illustrates a conventional LPCVD reactor utilized to deposit doped and undoped silicon layers on a batch of wafers.
Figure 2:
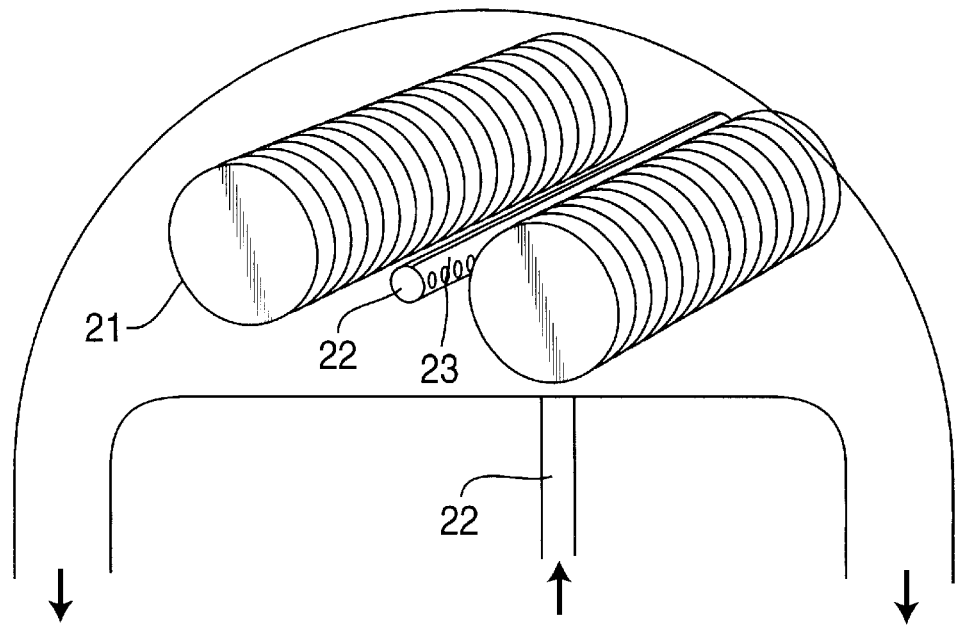
FIG. 2 illustrates another existing LPCVD reactor utilized to deposit doped and undoped silicon layers on a batch of wafers.

Doped silicon layers can also be produced by CVD, but generally at lower rates of deposition. Further, the prior art LPCVD deposition processes performed in the apparatus of FIGS. 1 and 2 produce films of nonuniform thickness. The feed gases are adjusted to admix an appropriate amount of dopant gas in addition to the silicon precursor gas. For example, small amounts of phosphine can be added to produce phosphorus-doped silicon, and small amounts of arsine can be added to produce arsenic-doped silicon.

The present process provides greatly increased deposition rates for doped silicon layers which are more uniform in thickness than the prior art layers.

Figure 3:
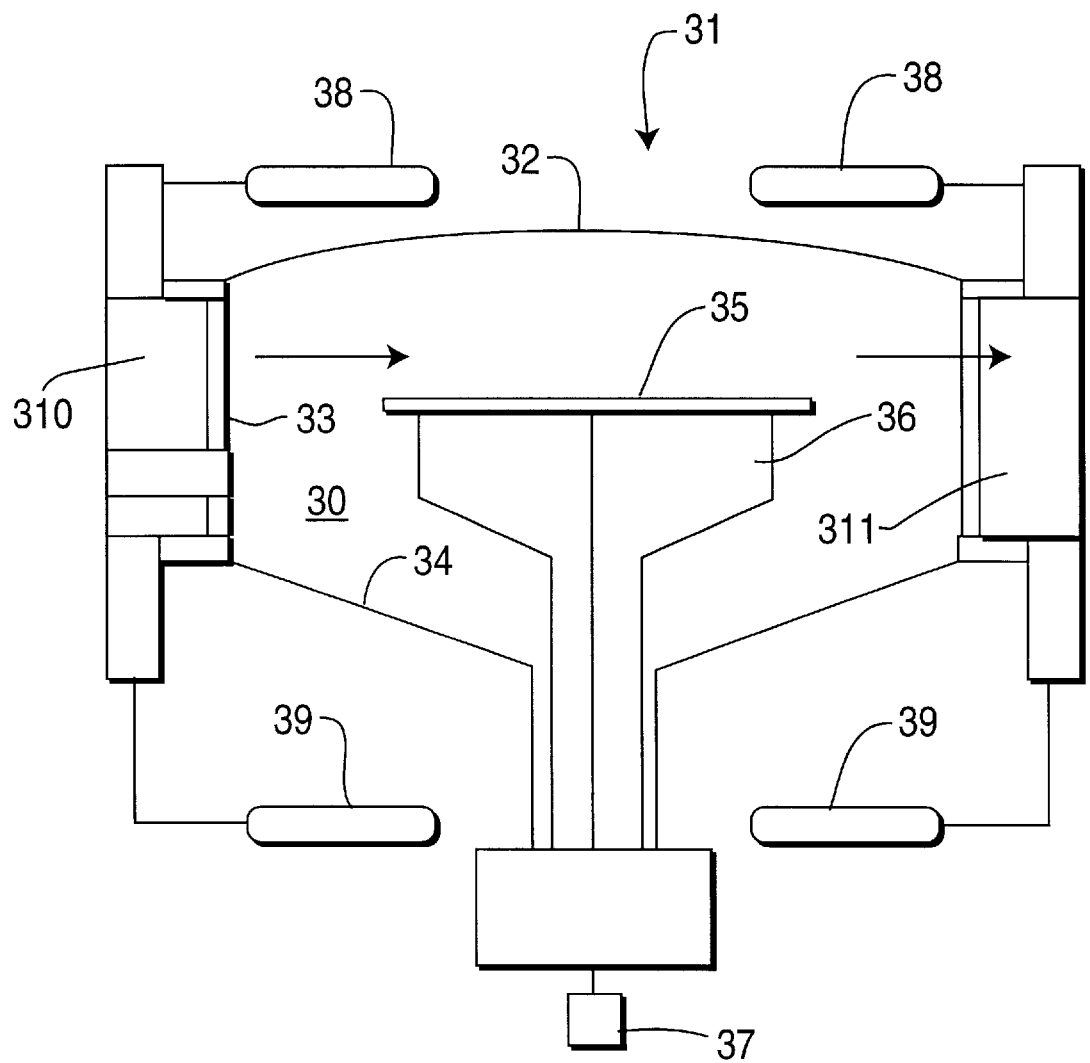
FIG. 3 illustrates a single wafer reactor in which silicon is deposited on wafers at high pressures in accordance with the invention.

The present process will be further described by reference to FIG. 3. FIG. 3 illustrates a single wafer reactor 31 in which either doped or undoped silicon layers can be deposited at commercially attractive rates. This reactor has a top wall 32, side walls 33 and a bottom wall 34 that define a reaction chamber 30 into which a single substrate such as a wafer 35 can be loaded. The wafer 35 is mounted on a pedestal 36 that is rotated by a motor 37 to provide a time averaged environment for the wafer that is cylindrically symmetric. The wafer 35 is heated by light from high intensity lamps 38 and 39. The top wall 32 and the bottom wall 34 should be substantially transparent to light to enable the light from the lamps 38 and 39 to enter the chamber 30. Quartz is a particularly useful choice for the top and bottom walls 32 and 34 because it is transparent to light at visible and uv frequencies; because quartz is a relatively high strength material that can support a large pressure difference between the inside and the outside of the chamber; and because quartz has a low rate of outgassing.

Reactant gases flow from a gas input port 310 and across the wafer 35 to an exhaust port 311. The gas input port 310 is connected to a gas manifold that provides one or a mixture of gases to enter via a plurality of pipes into this slot. The locations of the input ends of these pipes, the gas concentrations and/or flow rate through each of these pipes are selected to produce reactant gas flow and concentration profiles that optimize processing uniformity. Although the rotation of the wafer and thermal gradients caused by the heat from lamps 38 and 39 can significantly affect the flow profile of gases in the reaction chamber 30, the dominant shape of the flow profile is laminar flow from the gas input port and across the wafer to the exhaust port 311.

In a typical process producing an undoped silicon layer on a silicon wafer, a pressure of 80 Torr in a vacuum chamber was maintained by feeding hydrogen at about 10 liters per minute into the chamber and adding about 525 sccm of silane after the temperature of the wafer reached 650° C. A mixture of about 50:50 polycrystalline and amorphous silicon was deposited at a rate of 2000 angstroms per minute.

At a higher wafer temperature of about 700° C. using about 250 sccm of silane, the deposited silicon was polycrystalline silicon.

Phosphorus doped polycrystalline silicon was deposited onto a wafer in the chamber of FIG. 3 by feeding a mixture of 525 sccm of silane and 300 sccm of 1% phosphine in hydrogen at a temperature of 650° C. The resultant silicon layer contained about $1.5 \times 10^{21}$ $cm^3$ of phosphorus and was deposited at a rate of about 1500 angstroms per minute.

Although the invention has been described with reference to particular pressures, temperature and reaction chamber type, one skilled in the art will recognize that other pressures, temperatures, gas feedstocks and deposition chambers can be substituted and are meant to be included herein. The invention is only meant to be limited by the appended claims.

We Claim:

1. A thermal CVD method of depositing a layer comprising doped or undoped polycrystalline silicon comprising:

a) loading a substrate into a chemical vapor deposition vacuum chamber;

b) controlling the temperature of the substrate to between about 600° and 750° C.; and c) adding a silane selected from the group consisting of monosilane, disilane, monosilane mixed with a dopant gas, and disilane mixed with a dopant gas, to the chamber and maintaining the pressure of the chamber between about 10 and 350 Torr until the silicon layer is deposited on the substrate.

2. A method according to claim 1 wherein the pressure is maintained at between about 25 to 190 Torr.

3. A method according to claim 1 wherein the gas and temperature are controlled to produce phosphorus-doped polycrystalline silicon.

4. A method according to claim 1 wherein the pressure is maintained at from about 25–350 Torr and the deposition rate is about 500–3000 angstroms per minute.

5. A method according to claim 4 wherein the pressure is maintained at from about 25–150 Torr.

6. A method according to claim 1 wherein said silane is monosilane.

* * * * *